United States Patent
Allen, Jr. et al.

(10) Patent No.: US 10,569,299 B2
(45) Date of Patent: Feb. 25, 2020

(54) HYDROPHOBIC SHAFTS FOR USE IN PROCESS CHAMBERS

(71) Applicant: Varian Semiconductor Equipment Associates, Inc., Gloucester, MA (US)

(72) Inventors: Ernest E. Allen, Jr., Rockport, MA (US); Jonathan David Fischer, Lynn, MA (US); Jeffrey E. Krampert, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 12 days.

(21) Appl. No.: 15/941,084

(22) Filed: Mar. 30, 2018

(65) Prior Publication Data
US 2019/0299249 A1 Oct. 3, 2019

(51) Int. Cl.
*B05D 5/08* (2006.01)
*B05D 1/28* (2006.01)
*C23C 14/00* (2006.01)

(52) U.S. Cl.
CPC ............... *B05D 5/083* (2013.01); *B05D 1/28* (2013.01); *C23C 14/00* (2013.01); *B05D 5/08* (2013.01)

(58) Field of Classification Search
None
See application file for complete search history.

(56) References Cited

U.S. PATENT DOCUMENTS

| 3,644,137 | A | * | 2/1972 | Fox | D06B 21/00 8/151 |
|---|---|---|---|---|---|
| 4,374,891 | A | * | 2/1983 | Ward, III | B01D 69/122 428/220 |
| 2014/0261177 | A1 | * | 9/2014 | Rasheed | C23C 14/0063 118/720 |

* cited by examiner

*Primary Examiner* — Jethro M. Pence
(74) *Attorney, Agent, or Firm* — Nields, Lemack & Frame, LLC

(57) ABSTRACT

A system that reduces the amount of water that enters a process chamber via a movable shaft is disclosed. The surface of the shaft is made hydrophobic. Any water droplets that are collected on the hydrophobic shaft are disposed at a high contact angle, making it more likely that these water droplets fall from the shaft. Further, any water that enters the process chamber is more readily removed from the shaft due to the lower energy of liberation. Reducing the amount of water in a process chamber may improve the lifetime of the components in the process chamber and may improve the yield of the workpieces being processed. This may be especially relevant when process gasses that contain halogens are employed.

9 Claims, 3 Drawing Sheets

HYDROPHOBIC SHAFTS FOR USE IN PROCESS CHAMBERS

FIELD

Embodiments of the present disclosure relate to hydrophobic surface treatment of shafts for use in process chambers, and more particularly, hydrophobic shafts that extend into a process chamber via an air bearing.

BACKGROUND

In certain processing systems, a workpiece is disposed in a process chamber, which is maintained at vacuum conditions. The workpiece may also be disposed on a movable shaft in the process chamber that allows the workpiece to be moved relative to the incoming ion beam.

In these systems, the movable shaft passes through an opening in a wall in the process chamber such that part of the shaft is disposed outside the process chamber, while a second part of the shaft is within the process chamber. An air bearing may be used to provide near frictionless motion between the shaft and the wall. The air bearing also serves to maintain the pressure difference between the process chamber and the outside environment. The shaft is able to be translated so that the portion of the shaft that is disposed within the process chamber can be increased or reduced.

Contaminants, such as water vapor, may collect on the portion of the shaft that is disposed outside the process chamber. As the shaft is translated relative to the wall of the process chamber, these contaminants may enter the process chamber through the air bearing. Once inside the process chamber, these contaminants can affect the yield of the workpieces, or may negatively affect the components within the process chamber.

Therefore, it would be beneficial if there were a system that allowed a shaft to be moved relative to the wall of a process chamber, while reducing or minimizing the amount of contaminants that are introduced into the process chamber as the shaft extends into the chamber.

SUMMARY

A system that reduces the amount of water that enters a process chamber via a movable shaft is disclosed. The surface of the shaft is made hydrophobic. Any water droplets that are collected on the hydrophobic shaft are disposed at a high contact angle, making it more likely that these water droplets fall from the shaft before entering the process chamber. Further, any water that enters the process chamber is more readily removed from the shaft due to the lower energy of liberation. Reducing the amount of water in a process chamber may improve the lifetime of the components in the process chamber and may improve the yield of the workpieces being processed. This may be especially relevant when process gasses that contain halogens are employed.

According to one embodiment, a workpiece processing system is disclosed. The workpiece processing system comprises a process chamber, maintained at vacuum conditions; and a shaft extending through a wall of the process chamber, wherein the shaft can be extended into and retracted from the process chamber; wherein a surface of the shaft is hydrophobic. In certain embodiments, a hydrophobic coating is disposed on the shaft. In certain embodiments, the hydrophobic coating may comprise fluoropolymers or siloxanes. In some embodiments, a hydrophobic coating is disposed on at least one wall of the process chamber.

According to another embodiment, a method of operating a process chamber is disclosed. The method comprises applying a hydrophobic coating to a shaft that extends into and retracts from the process chamber through an opening in a wall of the process chamber; processing a plurality of workpieces in the process chamber after the applying; and pausing operation of the process chamber after the processing so that the hydrophobic coating can be reapplied to the shaft. In certain embodiments, the hydrophobic coating is applied by wiping a hydrophobic material onto the shaft. In certain embodiments, the hydrophobic material is selected based on compatibility with a species used to process a workpiece disposed in the process chamber. In some embodiments, the amount of water that enters the process chamber attached to the shaft is reduced by applying the hydrophobic coating. In some embodiments, the amount of water that enters the process chamber attached to the shaft is more easily removed from the shaft due to the hydrophobic coating. The pausing may occur after a predetermined number of workpieces are processed or after a predetermined amount of time.

In another embodiment, a workpiece processing system is disclosed. The system comprises a process chamber, maintained at vacuum conditions; a shaft extending through a wall of the process chamber, wherein the shaft can be extended and retracted from the process chamber; a hydrophobic coating disposed on the shaft; and an air bearing to provide an interface between the wall and the shaft. In certain embodiments, the hydrophobic coating may comprise fluoropolymers or siloxanes. In some embodiments, a hydrophobic coating is disposed on at least one wall of the process chamber.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain systems, a workpiece is moved relative to the ion source via a movable shaft. A portion of this movable shaft may extend outside the process chamber. Additionally, the actuator that controls the movement of the shaft may also be disposed outside the process chamber. The process chamber is typically maintained at vacuum conditions, which is defined to be less than 50 millitorr. In certain embodiments, the process chamber may be maintained at less than 10 millitorr. In some embodiments, the process chamber is maintained at between 10e-3 and 10e-7 torr. The environment outside the process chamber is typically at atmospheric pressure. An air bearing may be used to maintain the pressure differential between the outside environment and the process chamber. However, contaminants, such as water vapor, may collect on the portion of the shaft that is outside the process chamber. These contaminants may then enter the process chamber when the shaft is extended into the process chamber. As described above, these contaminants may affect the yield of the workpiece or affect the components within the process chamber.

Figure 1:
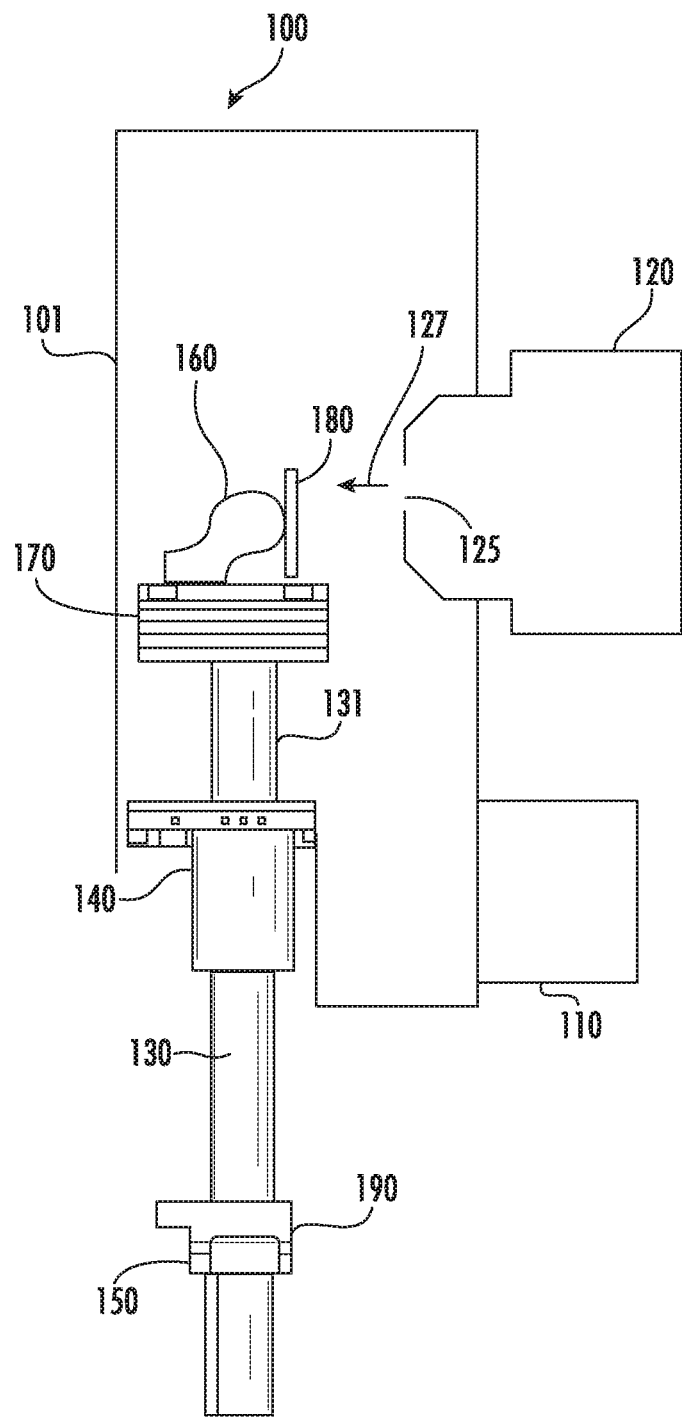
FIG. 1 is a view of the process chamber that utilizes the hydrophobic shaft according to one embodiment.

FIG. 1 shows a system that addresses this issue. The system includes a process chamber 100, which comprises a plurality of walls 101 that define a sealed chamber, which is maintained at vacuum conditions. One or more vacuum pumps 110 may be in communication with the interior of the process chamber 100 to maintain the vacuum pressure within the process chamber 100. As noted above, the pressure within the process chamber 100 may be less than 50 millitorr in certain embodiments. In other embodiments, the pressure within the process chamber 100 may be less than 10 millitorr. An ion source 120 may also be in communication with the process chamber 100. In certain embodiments, the extraction aperture 125 of the ion source 120 is disposed within the process chamber 100. In other embodiments, one or more components may be disposed between the ion source 120 and the process chamber 100. For example, a beam-line ion implantation system may have a mass analyzer, one or more acceleration/deceleration stages and a collimator disposed between the ion source 120 and the process chamber 100. Thus, while FIG. 1 shows the ion source 120 in direct communication with the process chamber 100, other embodiments are possible and the disclosure is not limited to the embodiment shown in FIG. 1. Thus, the process chamber 100 may be used for any process which may include additional or fewer components within the process chamber 100.

A shaft 130 extends into the process chamber 100 through a hole in a wall 101. The shaft 130 may be stainless steel. In certain embodiments, the shaft 130 may be chrome or nickel coated. In certain embodiments, an air bearing 140 is used to form the barrier between the vacuum conditions within the process chamber 100 and the atmospheric pressure external to the process chamber 100. The air bearing 140, disposed proximate the hole in wall 101, also creates a near frictionless interface between the shaft 130 and the wall 101 of the process chamber 100. The shaft 130 may be extended or retracted from the process chamber 100 by means of an actuator 150, which may be disposed outside the process chamber 100. A platen 160 is disposed at the end of the shaft 130 that is disposed in the process chamber 100.

During operation, an ion beam 127 may be extracted from the ion source 120 and directed toward the workpiece 180 that is disposed on the platen 160. The ion beam 127 may not be able to impact the entirety of the workpiece 180 at one time. Therefore, the workpiece 180 may be translated relative to the ion beam 127. This is performed by extending and retracting the shaft 130 through the hole in the wall 101 of the process chamber 100.

As stated above, an air bearing 140 may be utilized to maintain the vacuum seal and to allow near frictionless movement of the shaft 130 relative to the wall 101 of the process chamber 100. Air bearings use a layer of pressurized gas between the shaft 130 and the wall 101 to provide a near frictionless interface.

When the shaft 130 is extended to its maximum position in the process chamber 100, a first fraction of the shaft 130 is disposed within the process chamber 100. Conversely, when the shaft 130 is retracted to its minimum position in the process chamber, a second fraction, smaller than the first fraction, is disposed in the process chamber 100. The retraction of the shaft 130 from the process chamber 100 may be limited by a first end stop 170. Similarly, the extension of the shaft 130 into the process chamber 100 may be limited by a second end stop 190. The end stops define the range of motion of the shaft 130.

It has been found that, in conventional systems, contaminants, such as water vapor, may collect on the surface of the portion of the shaft 130 that is disposed outside the process chamber 100. When the shaft 130 is then extended into the process chamber 100, these contaminants pass through the air bearing 140 and the hole in the wall 101 and enter the process chamber 100. In some cases, the vacuum pump 110 may draw these contaminants away from the shaft 130. However, the contaminants may affect the workpiece 180 or the other components. In one specific example, the ion beam 127 may comprise halogenated ions, such as fluorine ions. Water vapor may be disposed on the shaft 130. The hydrogen in the water vapor may react with the halogenated ions to form volatile compounds, such as HF or HCl. These acids may cause deleterious effects within the process chamber 100. For example, the acids may damage the shaft 130. The acids may become airborne and damage other components within the process chamber 100, such as the platen 160 or the ion source 120.

To overcome these issues, the surface of the shaft 130 of FIG. 1 is made hydrophobic. This may be done by treating the surface of the shaft 130 with a hydrophobic coating 131. In this disclosure, the term hydrophobic refers to a surface that forms a contact angle with water of greater than 90°. In certain embodiments, the contact angle may be greater than 120°, and in some embodiments, greater than 150°. In certain embodiments, a surface having a contact angle greater than 150° may be referred to as super hydrophobic.

In certain embodiments, coatings that have low surface energy may be applied. For example, a fluoropolymer may be applied to the shaft 130 as a hydrophobic coating 131. In other embodiments, a siloxane may be applied as the hydrophobic coating 131. The choice of coating chemistry may be made to insure the best compatibility with the species used in the ion beam to process the workpiece 180. For example, a fluoropolymer may be best suited when the ion source 120 uses a fluorinated species, such as $CF_4$, $CH_3F$, $C_4F_8$ or $CHF_3$. These hydrophobic chemistries are commonly prepared in an alcohol suspension that allows them to be easily applied by spraying, wiping or dipping.

Figure 2:
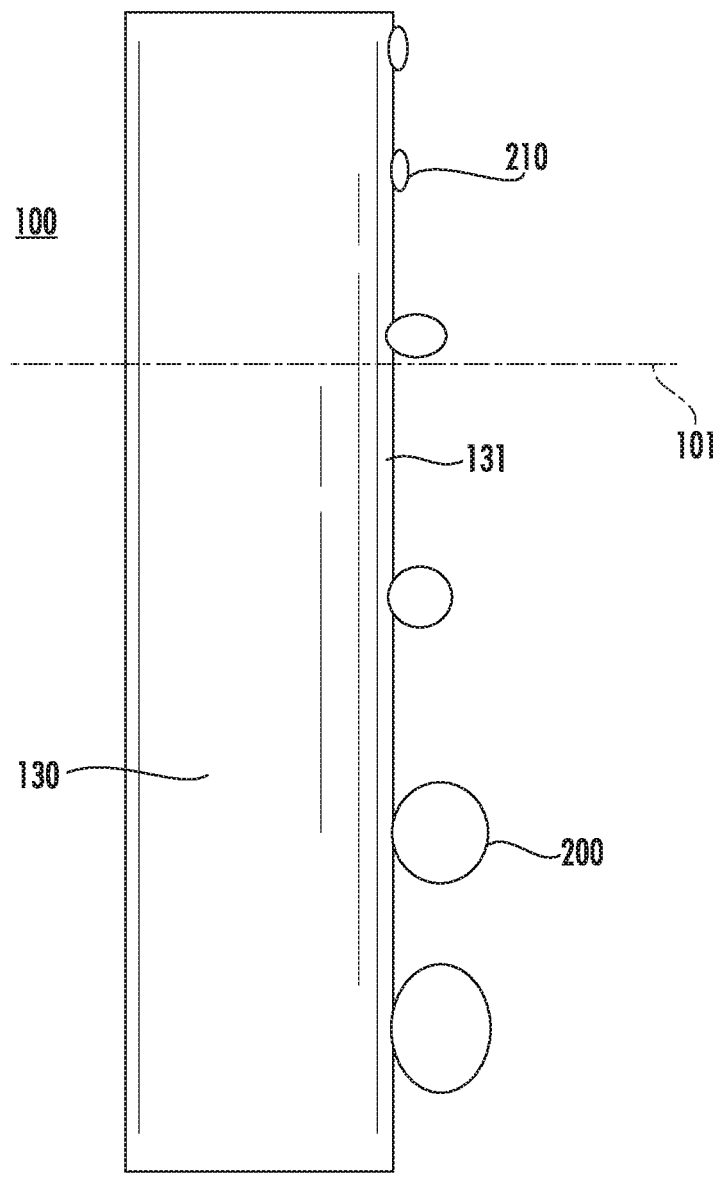
FIG. 2 shows the disposition of water vapor using the hydrophobic shaft.

In operation, the hydrophobic coating 131 performs two functions that each serve to reduce the amount of water that is present in the process chamber 100. These functions are illustrated in FIG. 2. First, when a portion of the shaft 130 is disposed outside the process chamber 100, the hydrophobic coating 131 causes the water molecules to attach to the surface of this portion of the shaft 130 with very high contact angles. This increases the likelihood that the water droplets 200 will be pulled away from this portion of the shaft 130 by gravity. In other words, the hydrophobic coating 131 reduces the ability of the water droplets 200 to adhere to the surface of this portion of the shaft 130 and consequently, larger water droplets 200 fall off this portion of the shaft 130 due to gravity. This results in less water adhering to the surface of the portion of the shaft 130 that is disposed outside the process chamber 100. Thus, due to this feature, less water is introduced into the process chamber 100 through the air bearing 140 as the shaft 130 is extended through the opening in the wall 101 and into the process chamber 100.

Additionally, water 210 that is transported into the process chamber 100 is more readily liberated from the shaft 130 by the vacuum pumps 110. Specifically, the energy of liberation of these monolayers of water 210 is significantly less because of the hydrophobic coating 131. This allows the water molecules that enter the process chamber 100 to be more readily removed from the shaft 130 and extracted by the vacuum pump 110.

Thus, less water enters the process chamber 100, and the water that does enter the process chamber 100 is more easily removed and exhausted.

Figure 3:
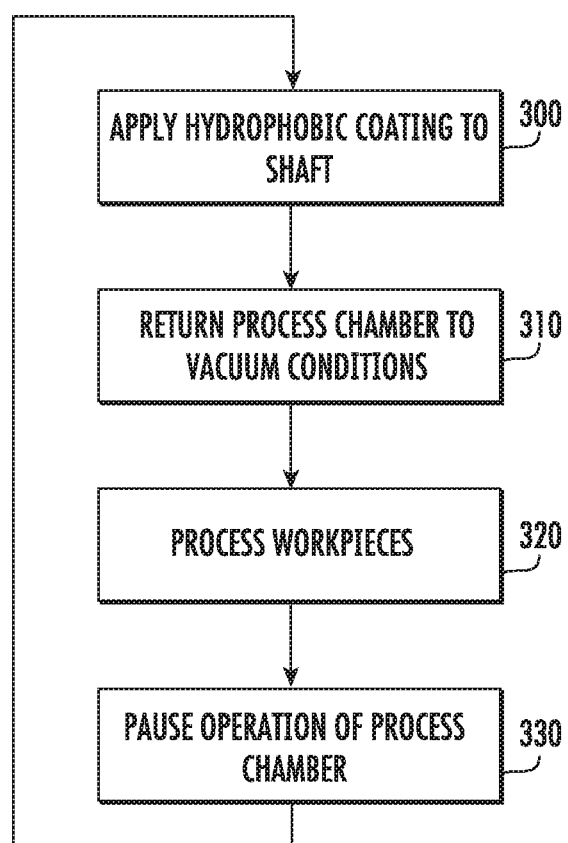
FIG. 3 shows a method of operating the process chamber of FIG. 1.

In certain embodiments, the hydrophobic coating 131 may wear away over time. Thus, in these embodiments, the hydrophobic coating 131 may be applied to the surface of the shaft 130 at regular intervals. FIG. 3 shows a method of operating the process chamber 100. First, as shown in Box 300, the hydrophobic coating 131 is applied to the shaft 130. A hydrophobic material may be wiped onto the surface of the shaft 130 leaving a coating of 1-400 microns. This hydrophobic material may be applied to the portion of the shaft 130 that is disposed in the process chamber 100, and the portion of the shaft 130 that is disposed outside of the process chamber 100. After the hydrophobic coating 131 has been applied, the process chamber 100 may be returned to vacuum conditions, as shown in Box 310. The process chamber 100 may then be used to process one or more workpieces, as shown in Box 320. After a predetermined number of workpieces have been processed, or after a predetermined period of time, the operation of the process chamber 100 is paused, as shown in Box 330. This pause may correspond to scheduled preventative maintenance cycle or may be determined in another manner. Once paused, the hydrophobic coating 131 can be reapplied to the shaft, as shown in Box 300. The frequency of the application of this hydrophobic coating 131 may depend on the process chemistries and the number of cycles that have been performed. In certain embodiments, the hydrophobic coating 131 may be reapplied during each preventative maintenance cycle.

While the above disclosure describes a shaft 130 with a hydrophobic coating 131 that is applied thereto, other embodiments are also possible. For example, in certain embodiments, the surface of the shaft 130 may be manufactured so as to be hydrophobic. In one embodiment, the stainless steel shaft may be etched using a hydrofluoric acid bath. After this, a fluorocarbon film may be deposited on the shaft 130 to make the surface of the shaft 130 hydrophobic. Of course, other methods of making the surface of the shaft hydrophobic are also possible and within the scope of the disclosure.

Further, while the above disclosure describes the hydrophobic coating 131 of the shaft 130, other components may also be coated. For example, the walls 101 of the process chamber 100 may also be coated with a hydrophobic material. This coating will reduce the energy of liberation of any water monolayers that may be disposed on these walls 101. By applying the hydrophobic coating to both the walls 101 and the shaft 130, the water molecules are more likely to become airborne, which allows them to be more easily purged from the process chamber 100.

Additionally, the above disclosure describes the use of an air bearing 140 to create the seal between the process chamber 100 and the outside environment. However, the disclosure is not limited to this embodiment. Rather, any mechanism that allows the shaft 130 to pass through an opening in a wall 101 and to be extended into and retracted from the process chamber 100 may be utilized.

The system and method described herein have many advantages. First, amount of water that enters a process chamber 100 via the shaft 130 is greatly reduced. As noted above, in certain embodiments, the ion beam 127 contains fluoride ions, which react vigorously with water molecules to form ozone and hydrofluoric acid. The hydrofluoric acid may etch the shaft 130, the walls 101 of the process chamber 100, or another component within the process chamber 100. Thus, this possibility of this reaction is minimized by reducing the amount of water that enters the process chamber 100 via the shaft 130. Second, the hydrophobicity of the shaft 130 allows any water that remains on the shaft 130 to be more easily liberated from the shaft 130 and to become airborne. Once airborne, these water molecules are more easily purged by the vacuum pumps 110. Third, the use of a hydrophobic coating 131 may allow existing shafts to be treated without need for retrofit or replacement of any components.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing system, comprising:
 a process chamber, maintained at vacuum conditions; and
 a shaft extending through a wall of the process chamber, wherein the shaft can be extended into and retracted from the process chamber;
 wherein the shaft is hydrophobic.

2. The workpiece processing system of claim 1, wherein a hydrophobic coating is disposed on the shaft.

3. The workpiece processing system of claim 2, wherein the hydrophobic coating comprises fluoropolymers.

4. The workpiece processing system of claim 2, wherein the hydrophobic coating comprises siloxanes.

5. The workpiece processing system of claim 1, wherein a hydrophobic coating is disposed on at least one wall of the process chamber.

6. A workpiece processing system, comprising:
 a process chamber, maintained at vacuum conditions;
 a shaft extending through a wall of the process chamber, wherein the shaft can be extended and retracted from the process chamber;
 a hydrophobic coating disposed on the shaft; and
 an air bearing to provide an interface between the wall and the shaft.

7. The workpiece processing system of claim 6, wherein the hydrophobic coating comprises fluoropolymers.

8. The workpiece processing system of claim 6, wherein the hydrophobic coating comprises siloxanes.

9. The workpiece processing system of claim 6, wherein the hydrophobic coating is disposed on at least one wall of the process chamber.

\* \* \* \* \*